United States Patent
Tapily et al.

(10) Patent No.: US 10,008,564 B2
(45) Date of Patent: Jun. 26, 2018

(54) METHOD OF CORNER ROUNDING AND TRIMMING OF NANOWIRES BY MICROWAVE PLASMA

(71) Applicant: Tokyo Electron Limited, Minato-ku, Tokyo (JP)

(72) Inventors: Kandabara N. Tapily, Mechanicville, NY (US); Ying Trickett, Albany, NY (US); Chihiro Tamura, Albany, NY (US); Cory Wajda, Sand Lake, NY (US); Gerrit J. Leusink, Rexford, NY (US); Kaoru Maekawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/342,968

(22) Filed: Nov. 3, 2016

(65) Prior Publication Data
US 2017/0125517 A1    May 4, 2017

Related U.S. Application Data

(60) Provisional application No. 62/250,395, filed on Nov. 3, 2015.

(51) Int. Cl.
| | | |
|---|---|---|
| *H01L 21/311* | (2006.01) | |
| *H01L 21/30* | (2006.01) | |
| *H01L 21/46* | (2006.01) | |
| *H01L 29/06* | (2006.01) | |
| *H01L 21/02* | (2006.01) | |
| *H01L 29/16* | (2006.01) | |

(52) U.S. Cl.
CPC .... *H01L 29/0673* (2013.01); *H01L 21/02236* (2013.01); *H01L 21/02238* (2013.01); *H01L 21/31116* (2013.01); *H01L 29/16* (2013.01); *H01L 21/02252* (2013.01)

(58) Field of Classification Search
CPC ......... H01L 21/33; H01L 21/46; H01L 21/76; H01L 21/02; H01L 29/06; H01L 21/30
USPC ........................ 438/700–706, 308, 282, 283; 257/E29.127, E29.137, E21.206, E21.415
See application file for complete search history.

(56) References Cited

U.S. PATENT DOCUMENTS

| | | | |
|---|---|---|---|
| 6,235,643 B1 * | 5/2001 | Mui | ..................... H01L 21/3065 156/345.24 |
| 6,852,584 B1 | 2/2005 | Chen et al. | |

(Continued)

OTHER PUBLICATIONS

Korean Intellectual Property Office, The International Search Report and The Written Opinion for International Application No. PCT/US2016/060378, dated Feb. 21, 2017, pp. 15.

*Primary Examiner* — Sheikh Maruf

(57) ABSTRACT

Embodiments of the invention describe a method of corner rounding and trimming of nanowires used in semiconductor devices. According to one embodiment, the method includes providing in a process chamber a plurality of nanowires separated from each other by a void, where the plurality of nanowires have a height and at least substantially right angle corners, forming an oxidized surface layer on the plurality of nanowires using an oxidizing microwave plasma, removing the oxidized surface layer to trim the height and round the corners of the plurality of nanowires, and repeating the forming and removing at least once until the plurality of nanowires have a desired trimmed height and rounded corners.

19 Claims, 7 Drawing Sheets

(56) References Cited

U.S. PATENT DOCUMENTS

| | | | |
|---|---|---|---|
| 7,452,778 B2 | 11/2008 | Chen et al. | |
| 7,981,763 B1 | 7/2011 | Van Schravendijk et al. | |
| 8,110,471 B2 | 2/2012 | Lee et al. | |
| 2002/0197477 A1* | 12/2002 | Ata | C04B 35/536 428/408 |
| 2005/0191803 A1* | 9/2005 | Matsuse | H01L 21/28061 438/202 |
| 2006/0134919 A1 | 6/2006 | Hamelin et al. | |
| 2006/0216897 A1 | 9/2006 | Lee et al. | |
| 2007/0209576 A1* | 9/2007 | Sunkara | B82Y 30/00 117/87 |
| 2008/0176413 A1* | 7/2008 | Sasaki | H01L 21/0214 438/792 |
| 2010/0207208 A1* | 8/2010 | Bedell | B82Y 10/00 257/346 |
| 2012/0196401 A1* | 8/2012 | Graham | H01L 31/035227 438/98 |
| 2013/0034968 A1* | 2/2013 | Zhang | H01L 21/31116 438/718 |
| 2013/0149852 A1* | 6/2013 | Nakamura | H01L 21/28079 438/585 |
| 2013/0267046 A1* | 10/2013 | Or-Bach | H01L 27/088 438/14 |
| 2013/0306975 A1* | 11/2013 | Levy | H01L 21/28282 257/66 |
| 2014/0038311 A1* | 2/2014 | Kim | H01L 43/12 438/3 |
| 2014/0151334 A1* | 6/2014 | Matsumoto | B82Y 40/00 216/69 |
| 2014/0183633 A1* | 7/2014 | Chen | H01L 29/7855 257/347 |
| 2015/0024559 A1 | 1/2015 | Xiao et al. | |
| 2015/0372119 A1* | 12/2015 | Zhang | B82Y 10/00 438/268 |
| 2017/0186778 A1* | 6/2017 | Miyake | H01L 27/1225 |
| 2017/0221716 A1* | 8/2017 | Shiraga | H01L 21/26506 |

* cited by examiner

METHOD OF CORNER ROUNDING AND TRIMMING OF NANOWIRES BY MICROWAVE PLASMA

CROSS-REFERENCE TO RELATED APPLICATIONS

This application is related to and claims priority to U.S. Provisional Patent Application Ser. No. 62/250,395 filed on Nov. 3, 2015, the entire contents of which are herein incorporated by reference.

BACKGROUND OF THE INVENTION

The semiconductor industry has relied on scaling/reducing device feature size in order to boost performance and increase transistor density. The continued device performance improvement due to scaling has seen the introduction of unique technologies such as semiconductor on insulator (i.e., SOI, GeOI, etc), and stressor such as SiGe and SiC, to improve mobility at the 90 nm node, epitaxial regrowth of source and drain (raised source and drain), high-k metal gate (HKMG) at the 45 nm node, and 3D structures such as FinFETs and trigates at the 22 nm node.

Maintaining the device performance and good short channel control is quite challenging beyond the 14 nm technology node. New materials (e.g., semiconductors, Ge, SiGe, graphene, $MoS_2$, $WS_2$, $MoSe_2$, and $WS_2$) and new integration schemes (e.g., nanowires) are needed. Nanowires offer scaling of feature size, good short channel control, and enhancement in the device electron mobility, hence enhancement in device speed.

SUMMARY OF THE INVENTION

A method of corner rounding and trimming of nanowires used in semiconductor devices is described in several embodiments. According to one embodiment, the method includes providing in a process chamber a plurality of nanowires separated from each other by a void, where the plurality of nanowires have a height and at least substantially right angle corners, forming an oxidized surface layer on the plurality of nanowires using an oxidizing microwave plasma, removing the oxidized surface layer to trim the height and round the corners of the plurality of nanowires, and repeating the forming and removing at least once until the plurality of nanowires have a desired trimmed height and rounded corners.

According to another embodiment, the method includes providing in a process chamber a plurality of nanowires separated from each other by a void, where the plurality of nanowires have a height and at least substantially right angle corners, forming a first oxidized surface layer on the plurality of nanowires using a first oxidizing microwave plasma at a first gas pressure, forming a second oxidized surface layer on the plurality of nanowires using a second oxidizing microwave plasma at a second gas pressure that is different than the first gas pressure, removing the first and second oxidized surface layers to trim the height and round the corners of the plurality of nanowires, and repeating the forming and removing steps at least once until the plurality of nanowires have a desired trimmed height and rounded corners. According to one embodiment, the first gas pressure can be less or equal to 1 Torr and the second gas pressure can be greater than 1 Torr.

DETAILED DESCRIPTION OF SEVERAL EMBODIMENTS

Embodiments of the invention describe a method of corner rounding and trimming of nanowires used in semiconductor devices. Methods for forming the nanowires can result in nanowires that have substantially right angle corners, which can lead to potential device performance degradation such as current crowding. The corner rounding and trimming described in the embodiments of the invention reduces an electric field concentration phenomenon that occurs at the corner of a conventional field effect transistor (FET) having a square-shaped nanowire channel.

Figure 1A:
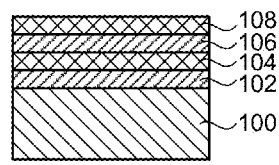
FIGS. 1A-1C schematically show a process flow for forming nanowires according to an embodiment of the invention.
Figure 1B:
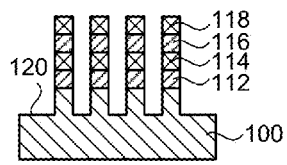
Figure 1C:
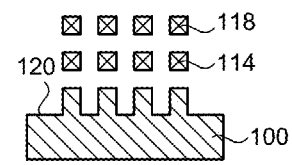

FIGS. 1A-1C schematically show a process flow for forming nanowires according to an embodiment of the invention. The process flow includes forming alternating Si films 104, 108 and SiGe films 102, 106 on a substrate 100, as shown in a schematic cross-sectional view in FIG. 1A. The process flow further includes, in FIG. 1B, performing an anisotropic etch process to form patterned alternating Si features 114, 118 and SiGe features 112, 116 on the substrate 100. FIG. 1B further shows a recess 120 formed in the substrate 100 by the anisotropic etch process. Thereafter, as depicted in FIG. 1C, the SiGe features 112, 116 are selectively removed in an isotropic etch process to release the Si features 114, 118 that become Si nanowires 114, 118 that are separated by a void. As a result of the anisotropic etch process, the Si nanowires 114, 118 have at least substantially right angle corners. Only two Si nanowires 114, 118 are depicted in FIG. 1C but embodiments of the invention may be applied to any number of Si nanowires. According to another embodiment, the Si features 114, 118 may be replaced by SiGe features 112, 116 and the SiGe features 112, 116 replaced by Si features 112, 116, and the Si features 112, 116 selectively removing by an isotropic etch process to release the SiGe features 114, 118 to become SiGe nanowires 114, 118.

Figure 2A:
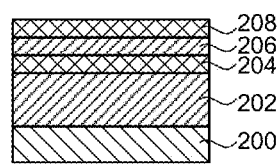
FIGS. 2A-2C schematically show a process flow for forming nanowires according to an embodiment of the invention.
Figure 2B:
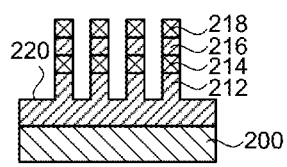
Figure 2C:
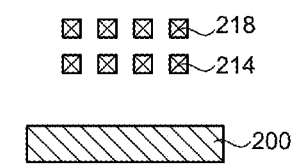

FIGS. 2A-2C schematically show a process flow for forming nanowires according to an embodiment of the invention. The process flow in FIGS. 2A-2C is similar to the process flow in FIGS. 1A-1C and includes forming alternating Si films 204, 208 and SiGe films 202, 206 on a substrate 200, where the SiGe film 202 is thicker than the Si film 206. The process flow further includes, in FIG. 2B, performing an anisotropic etch process to form patterned alternating Si features 214, 218 and SiGe features 212, 216 on the substrate 200. FIG. 2B further shows a recess 220 formed in the substrate 200 by the anisotropic etch process. Thereafter, as depicted in FIG. 2C, the SiGe features 212, 216 are selectively removed in an isotropic etch process to release the Si features 214, 218 that become Si nanowires 214, 218 that are separated by a void. According to another embodiment, the Si features 214, 218 may be replaced by SiGe features 212, 216 and the SiGe features 212, 216 replaced by Si features 214, 218, and the Si features 212, 216 selectively removed by an isotropic etch process to release the SiGe features 214, 218 that become SiGe nanowires 214, 218.

Figure 3A:
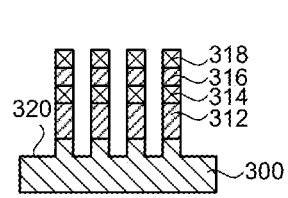
FIGS. 3A-3D schematically show a process flow for forming nanowires according to an embodiment of the invention.
Figure 3B:
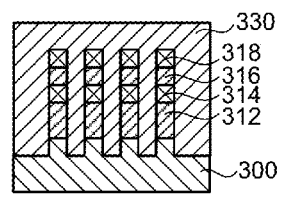
Figure 3C:
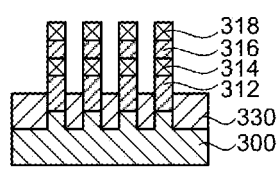
Figure 3D:
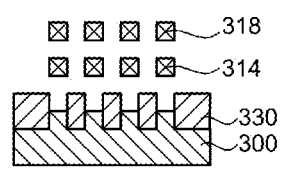

FIGS. 3A-3D schematically show a process flow for forming nanowires according to an embodiment of the invention. The process flow in FIGS. 3A-3D is similar to the process flow in FIGS. 2A-2C and includes forming by an anisotropic etch process patterned alternating Si features 314, 318 and SiGe features 312, 316 on the substrate 300, where the SiGe feature 312 is thicker than the SiGe feature 316. This is schematically shown in FIG. 3A which further shows a recess 320 formed in the substrate 300 by the anisotropic etch process. Thereafter, as depicted in FIG. 3B, a blanket dielectric layer 330 (e.g., $SiO_2$) is deposited over the structure in FIG. 3A. As depicted in FIG. 3C, the blanket dielectric layer 330 is partially etched to below the Si feature 314, and thereafter the SiGe features 312, 316 are selectively removed in an isotropic etch process to release the Si features 314, 318 that become Si nanowires 314, 318 that are separated by a void. According to another embodiment, the Si features 314, 318 may be replaced by SiGe features 312, 316 and the SiGe features 312, 316 replaced by Si features 314, 318, and the Si features 312, 316 selectively removed by an isotropic etch process to release the SiGe features 314, 318 that become SiGe nanowires 314, 318.

Figure 4:
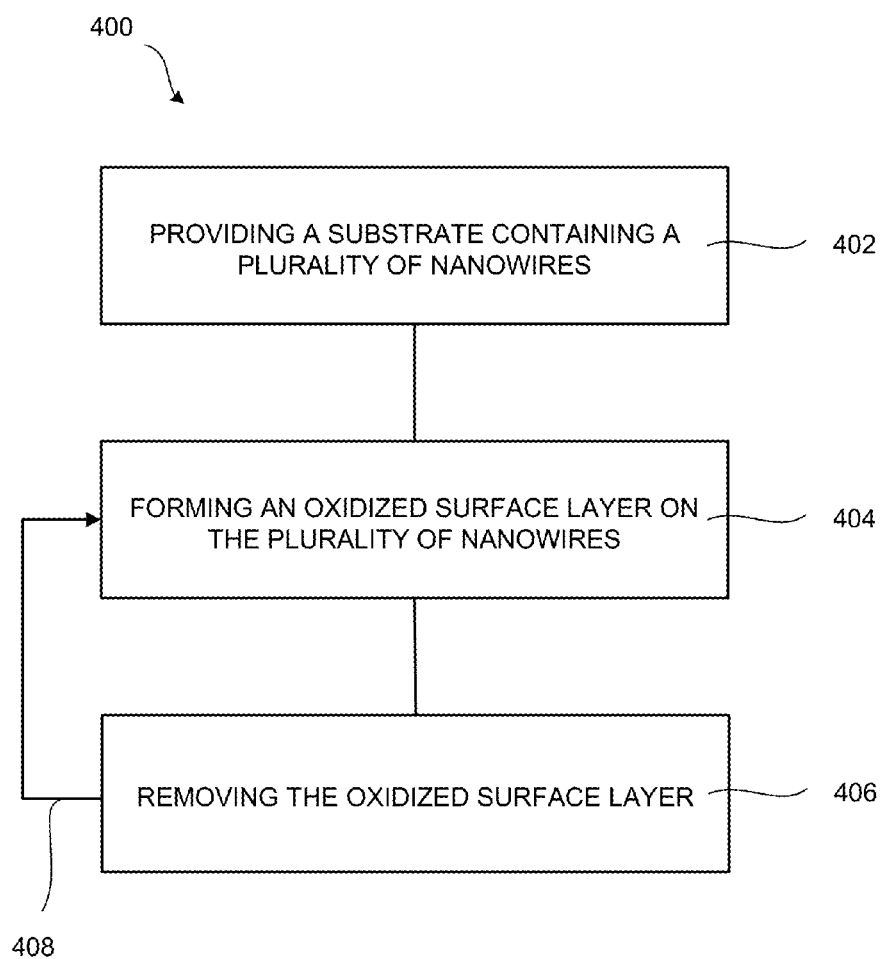
FIG. 4 shows a process flow diagram for a method of processing nanowires according to an embodiment of the invention.

FIG. 4 shows a process flow diagram 400 for a method of processing nanowires according to an embodiment of the invention. For example, the nanowires shown in FIGS. 1C, 2C, and 3D may be processed according to the process flow diagram 400. The method includes, in 402, providing in a process chamber a plurality of nanowires separated from each other by a void, where the plurality of nanowires have a height and at least substantially right angle corners. In some examples, the plurality of nanowires may have a height between about 10 nm and about 50 nm. The plurality of nanowires may, for example, be selected from the group consisting of Si, SiGe, and compound semiconductors.

The method further includes, in 404, forming an oxidized surface layer on the plurality of nanowires using an oxidizing microwave plasma that oxidizes the plurality of nanowires. In one example, the oxidizing microwave plasma includes plasma excited $O_2$ gas. According to one embodiment, the oxidizing microwave plasma utilizes a gas pressure of less or equal to 1 Torr in the process chamber. According to another embodiment, the oxidizing microwave plasma utilizes a gas pressure greater than 1 Torr in the process chamber. The use of the oxidizing microwave plasma provides very precise control over the thickness of the oxidized surface layer and prevents or reduces plasma damage to the nanowires. The oxidized surface layer may have a thickness of about 3 nm. In one example, the microwave plasma may be an RLSA™ plasma processing system available from Tokyo Electron Limited, Akasaka, Japan.

The method further includes, in 406, removing the oxidized surface layer from the plurality of nanowires to trim the height and round the corners of the plurality of nanowires. In one example, the removing includes a chemical oxide removal (COR) process that includes exposing the oxidized surface layer to HF gas and $NH_3$ gas to form reaction products on the plurality of nanowires, and thereafter heat-treating the plurality of nanowires to desorb the reaction products from the nanowires. The COR process provides high etch selectivity for oxide removal relative to Si and SiGe. The COR processing conditions can include a HF gas flow rate of 40 sccm, a $NH_3$ gas flow rate of 40 sccm, a substrate temperature of about 20-80° C., for example about 30° C., and a process chamber pressure of 40 mTorr. The heat-treating can include a substrate temperature of about 100-200° C., and a $N_2$ gas purge. In one example, a COR process may be performed in a Certas WING™, a high throughput gas plasma-free chemical etching system available from Tokyo Electron Limited, Akasaka, Japan.

As indicated by process flow arrow 408, steps 404 and 406 may be repeated at least once until the plurality of nanowires have a desired trimmed height and rounded corners. Since each cycle of steps 404 and 406 removes about 3 nm of material from each side of the plurality of nanowires, steps 404 and 406 are sequentially repeated a plurality of times, for example three or more times, to fully round the corners of the plurality of nanowires. Thereafter the processed nanowires may be further processed to form a semiconductor device. The further processing can include deposition of a dielectric layer that encapsulates the plurality of nanowires, and deposition of a metal-containing gate electrode layer that fills the remaining voids between the plurality of nanowires.

According to one embodiment, the method includes providing in a process chamber a plurality of nanowires separated from each other by a void, where the plurality of nanowires have a height and at least substantially right angle corners, and forming a first oxidized surface layer on the plurality of nanowires using a first oxidizing microwave plasma at a first gas pressure. The method further includes forming a second oxidized surface layer on the plurality of nanowires using a second oxidizing microwave plasma at a second gas pressure that is different than the first gas pressure, and removing the first and second oxidized surface layers to trim the height and round the corners of the plurality of nanowires. Each of the forming and removing steps may be repeated at least once until the plurality of nanowires have a desired trimmed height and rounded corners. In one example, the first gas pressure is less than the second gas pressure. In one example, the first gas pressure is less or equal to 1 Torr and the second gas pressure is greater than 1 Torr.

Figure 5:
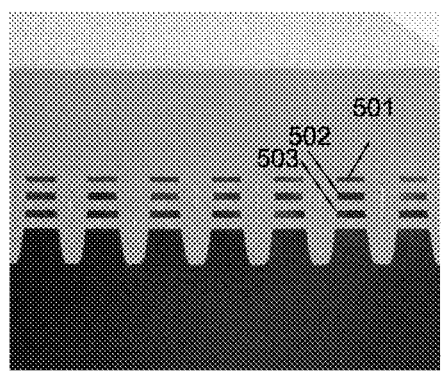
FIGS. 5-8 show cross-sectional transmission electron microscopy (TEM) images of Si nanowires according to an embodiment of the invention.
Figure 6:
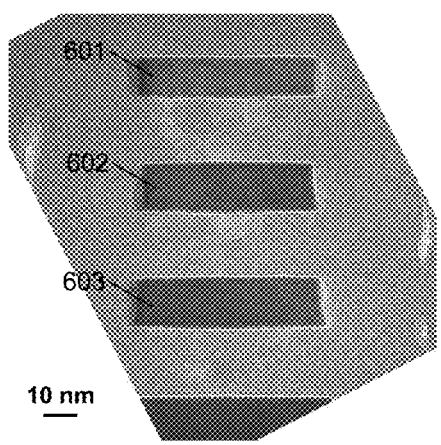
Figure 7:
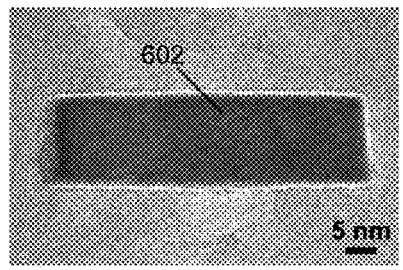
Figure 8:
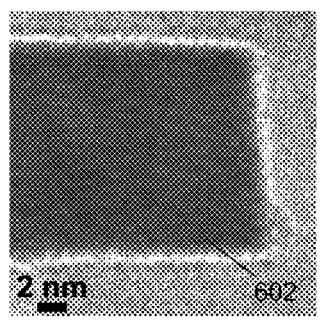

FIGS. 5-8 show cross-sectional transmission electron microscopy (TEM) images of Si nanowires according to an embodiment of the invention. FIG. 5 shows a cross-sectional TEM of multiple rows of Si nanowires where each row contains three released Si nanowires. One row with Si nanowires 501-503 is identified. The Si nanowires 501-503 have substantially right angle corners before being subject to the method of corner rounding and trimming according to an embodiment of the invention. FIG. 6 shows cross-sectional TEM images of Si nanowires 601-603, and FIGS. 7 and 8 show cross-sectional TEM images of Si nanowire 602 using different magnifications.

Figure 9:
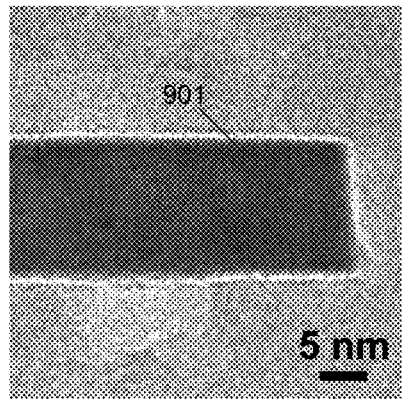
FIG. 9 shows a cross-sectional TEM image of a Si nanowire according to an embodiment of the invention.
Figure 10:
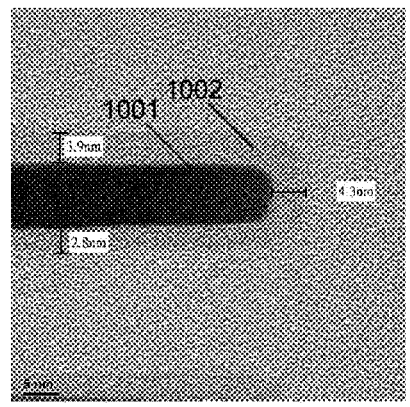
FIG. 10 shows a cross-sectional TEM image of a Si nanowire following a process of corner rounding and trimming according to an embodiment of the invention.

FIG. 9 show a cross-sectional TEM image of a Si nanowire 901, and FIG. 10 shows a cross-sectional TEM image of a Si nanowire 1001 following a process of corner rounding and trimming according to an embodiment of the invention. The process included exposing a Si nanowire 1001 having substantially right angle corners to an oxidizing microwave plasma containing plasma excited $O_2$ gas to form an oxidized surface layer on the Si nanowire 1001. The process chamber pressure was 1 Torr and the process gas consisted of $O_2$ gas and Ar gas. Thereafter, the oxidized surface layer was removed from the Si nanowire 1001 using a COR process. The exposure to the oxidizing microwave plasma and the subsequent COR process was repeated 3 times to further trim and round the corners of the Si nanowire 1001. Thereafter, the nanowire was prepared for analysis by further oxidizing the Si nanowire 1001 to form oxidized region 1002 (i.e., $SiO_2$) overlying an un-oxidized region of the Si nanowire 1001. FIG. 10 clearly shows the effectiveness of the inventive process to trim the height and round the corners of the Si nanowire 1001.

Figure 11:
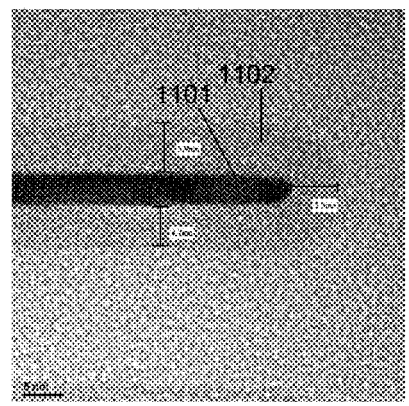
FIG. 11 shows a cross-sectional TEM image of a Si nanowire following a process of corner rounding and trimming according to an embodiment of the invention.

FIG. 11 shows a cross-sectional TEM image of a Si nanowire 1101 following a process of corner rounding and trimming according to an embodiment of the invention. The processing included exposing a Si nanowire 1101 having substantially right angle corners to an oxidizing microwave plasma containing plasma excited $O_2$ gas at a process chamber pressure of 0.1 Torr to form a first oxidized surface layer on the Si nanowire 1101. Thereafter, the Si nanowire 1101 was exposed to an oxidizing microwave plasma containing plasma excited $O_2$ gas at a process chamber pressure of 5 Torr to form a second oxidized surface layer on the Si nanowire 1101. Thereafter, the first and second oxidized surface layers were removed from the Si nanowire 1101 using a COR process. The exposure to the oxidizing microwave plasma and the subsequent COR process was repeated 3 times to further trim and round the corners of the Si nanowire 1001. Thereafter, the Si nanowire 1101 was prepared for analysis by oxidizing the nanowire 1101 to form an oxidized region 1002 overlying an un-oxidized region of the Si nanowire 1001. FIG. 11 clearly shows the effectiveness of the inventive process to trim the height and round the corners of the Si nanowire 1101 using a oxidizing microwave plasma and two different process chamber pressures.

It is believed that low process chamber pressure (i.e., less or equal to 1 Torr), has a high concentration of oxygen ions compared to the concentration of neutral oxygen radicals in the oxidizing microwave plasma. In contrast, high process chamber pressure (i.e., greater than 1 Torr), has a low concentration of oxygen ions compared to the concentration of neutral oxygen radicals in the oxidizing microwave plasma. Oxygen ions in the plasma result in faster oxidation of the nanowires and are believed to have a stronger effect on corner rounding of the nanowires, whereas neutral oxygen radicals are believed to have a stronger effect on trimming the height (thickness) of the nanowires. Therefore, sequential exposures to oxidizing plasmas having different process chamber pressures may be utilized to in order to control the relative thickness and corner rounding of the nanowires.

Exemplary Microwave Plasma Processing Systems

Figure 12:
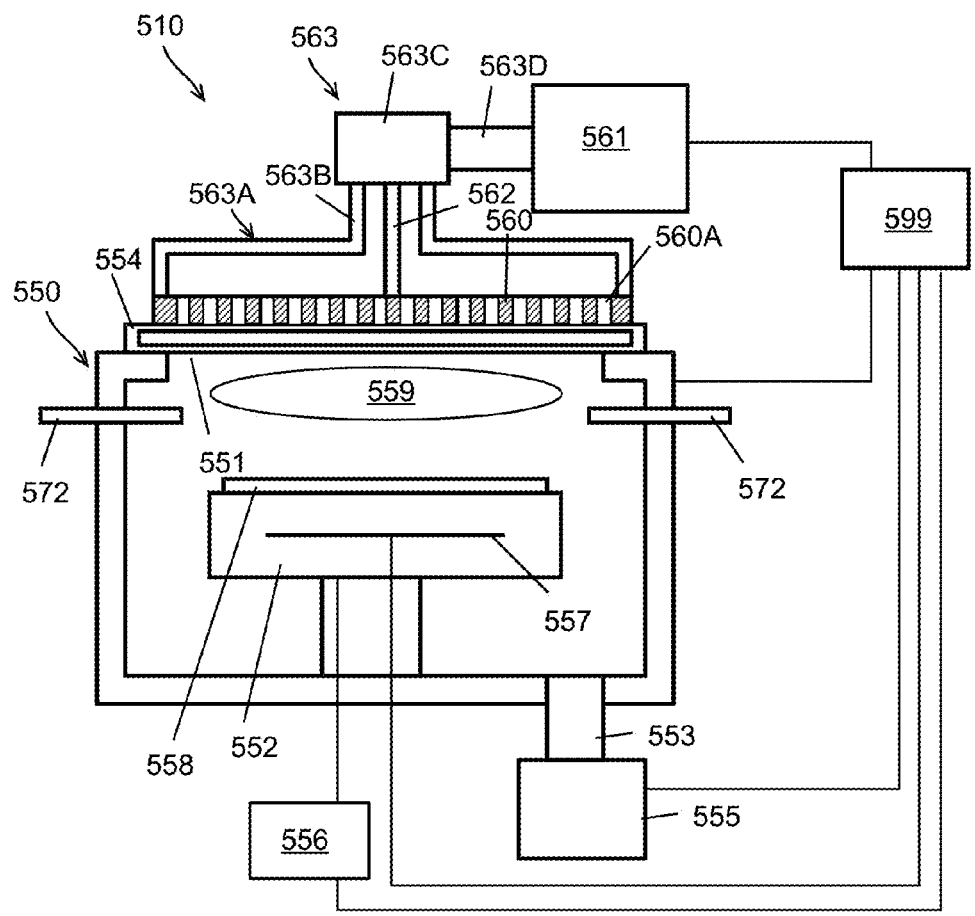
FIG. 12 is a schematic diagram of a plasma processing system containing a microwave plasma source for processing a substrate according to an embodiment of the invention.

FIG. 12 is a schematic diagram of a microwave plasma processing system containing a RLSA™ plasma for processing a substrate according to embodiments of the invention. The plasma produced in the plasma processing system 510 is characterized by low electron temperature and high plasma density. The plasma processing system 510 contains a plasma processing chamber 550 having an opening portion 551 in the upper portion of the plasma processing chamber 550 that is larger than a substrate 558. A cylindrical dielectric top plate 554 made of quartz, aluminum nitride, or aluminum oxide is provided to cover the opening portion 551.

Gas lines 572 are located in the side wall of the upper portion of plasma processing chamber 550 below the top plate 554. In one example, the number of gas lines 572 can be 16 (only two of which are shown in FIG. 12). Alternatively, a different number of gas lines 572 can be used. The gas lines 572 can be circumferentially arranged in the plasma processing chamber 550, but this is not required for the invention. A process gas can be evenly and uniformly supplied into the plasma region 559 in plasma processing chamber 550 from the gas lines 572.

In the plasma processing system 510, microwave power is provided to the plasma processing chamber 550 through the top plate 554 via a slot antenna 560 having a plurality of slots 560A. The slot antenna 560 faces the substrate 558 to be processed and the slot antenna 560 can be made from a metal plate, for example copper. In order to supply the microwave power to the slot antenna 560, a waveguide 563 is disposed on the top plate 554, where the waveguide 563 is connected to a microwave power supply 561 for generating microwaves with a frequency of about 2.45 GHz, for example. The waveguide 563 contains a flat circular waveguide 563A with a lower end connected to the slot antenna 560, a circular waveguide 563B connected to the upper surface side of the circular waveguide 563A, and a coaxial waveguide converter 563C connected to the upper surface side of the circular waveguide 563B. Furthermore, a rectangular waveguide 563D is connected to the side surface of the coaxial waveguide converter 563C and the microwave power supply 561.

Inside the circular waveguide 563B, an axial portion 562 of an electroconductive material is coaxially provided, so that one end of the axial portion 562 is connected to the central (or nearly central) portion of the upper surface of slot antenna 560, and the other end of the axial portion 562 is connected to the upper surface of the circular waveguide 563B, thereby forming a coaxial structure. As a result, the circular waveguide 563B is constituted so as to function as a coaxial waveguide. The microwave power can, for example, be between about 0.5 W/cm$^2$ and about 4 W/cm$^2$. Alternatively, the microwave power can be between about 0.5 W/cm$^2$ and about 3 W/cm$^2$. The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5 eV, below 4.5 eV, below 4 eV, or even below 3.5 eV. In some examples, the electron temperature can be between 3.0 and 3.5 eV, between 3.5 eV and 4.0 eV, or between 4.0 and 4.5 eV. The plasma may have a density of about $1\times10^{11}/cm^3$ to about $1\times10^{13}/cm^3$, or higher.

In addition, in the plasma processing chamber 550, a substrate holder 552 is provided opposite the top plate 554 for supporting and heating a substrate 558 (e.g., a wafer). The substrate holder 552 contains a heater 557 to heat the substrate 525, where the heater 557 can be a resistive heater. Alternatively, the heater 557 may be a lamp heater or any other type of heater. Furthermore the plasma processing chamber 550 contains an exhaust line 553 connected to the bottom portion of the plasma processing chamber 550 and to a vacuum pump 555.

The plasma processing system 510 further contains a substrate bias system 556 configured to bias the substrate holder 552 and the substrate 558 for generating a plasma and/or controlling energy of ions that are drawn to a substrate 558. The substrate bias system 556 includes a substrate power source configured couple power to the substrate holder 552. The substrate power source contains a RF generator and an impedance match network. The substrate power source is configured to couple power to the substrate holder 552 by energizing an electrode in the substrate holder 552. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. The substrate bias system 556 is configured for supplying RF bias power can be between 0 W and 100 W, between 100 W and 200 W, between 200 W and 300 W, between 300 W and 400 W, or between 400 W and 500 W. In some examples, the RF bias power can be less than 100 W, less than 50 W, or less than 25 W, for example. RF bias systems for plasma processing are well known to those skilled in the art. Further, the substrate bias system 556 includes a DC voltage generator capable of supplying DC bias between −5 kV and +5 kV to the substrate holder 552.

The substrate bias system 556 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. It is noted that one skilled in the art will appreciate that the power levels of the substrate bias system 556 are related to the size of the substrate being processed. For example, a 300 mm Si wafer requires greater power consumption than a 200 mm wafer during processing.

Still referring to FIG. 12, a controller 599 is configured for controlling the plasma processing system 510. The controller 599 can include a microprocessor, a memory, and a digital I/O port capable of generating control voltages sufficient to communicate and activate inputs of the plasma processing system 510 as well as monitor outputs from the plasma processing system 510. Moreover, the controller 599 is coupled to and exchanges information with plasma processing chamber 550, the vacuum pump 555, the heater 557, the substrate bias system 556, and the microwave power supply 561. A program stored in the memory is utilized to control the aforementioned components of plasma processing system 510 according to a stored process recipe. One example of controller 599 is a UNIX-based workstation. Alternatively, the controller 599 can be implemented as a general-purpose computer, digital signal processing system, etc.

Figure 13:
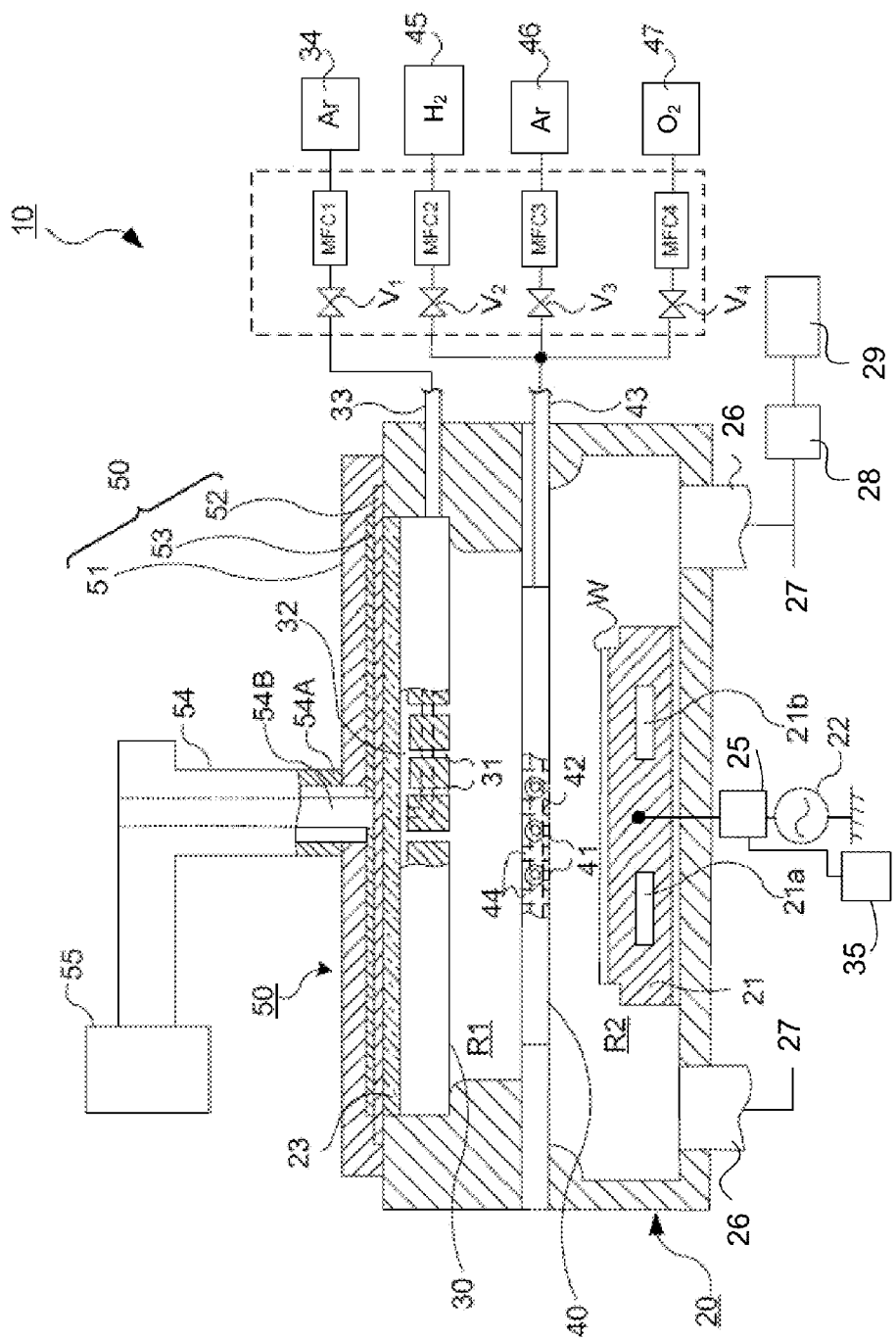
FIG. 13 is a schematic diagram of another plasma processing system containing a microwave plasma source for processing a substrate according to an embodiment of the invention.

FIG. 13 is a schematic diagram of a microwave plasma processing system containing a RLSA™ plasma for processing a substrate according to another embodiment of the invention. As shown in FIG. 13, the plasma processing system 10 includes a plasma processing chamber 20 (vacuum chamber), an antenna unit 50, and a substrate holder 21. Inside of the plasma processing chamber 20 is roughly sectionalized into a plasma generation region R1, located below a plasma gas supply unit 30, and a plasma diffusion region R2 above the substrate holder 21. A plasma generated in the plasma generation region R1 can have an electron temperature of several electron volts (eV). When the plasma is diffused into the plasma diffusion region R2, where the film formation process is performed, the electron temperature of the plasma near the substrate holder 21 may drop to a value of lower than about 2 eV. The substrate holder 21 is located centrally on a bottom portion of the plasma processing chamber 20 and serves as a substrate holder for supporting a substrate W. Inside the substrate holder 21, there is provided an insulating member 21a, a cooling jacket 21b, and a temperature control unit (not shown) for controlling the substrate temperature.

A top portion of the plasma processing chamber 20 is open-ended. The plasma gas supply unit 30 is placed opposite to the substrate holder 21 and is attached to the top portion of the plasma processing chamber 20 via sealing members such as O rings (not shown). The plasma gas supply unit 30, which may also function as a dielectric window, can be made of materials such as aluminum oxide or quartz and has a planar surface. A plurality of gas supply holes 31 are provided opposite the substrate holder 21 on a planar surface of the plasma gas supply unit 30. The plurality of gas supply holes 31 communicate with a plasma gas supply port 33 via a gas flow channel 32. A plasma gas supply source 34 provides a plasma gas, for example argon (Ar) gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is centered in the plasma processing chamber 20 between the plasma generation region R1 and the plasma diffusion region R2. The process gas supply unit 40 may be made of a conducting material, for example an aluminum alloy that includes magnesium (Mg), or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21.

The plasma processing chamber 20 further includes exhaust lines 26 connected to the bottom portion of the plasma processing chamber 20, a vacuum line 27 connecting the exhaust lines 26 to a pressure controller valve 28 and to a vacuum pump 29. The pressure controller valve 28 may be used to achieve a desired gas pressure in the plasma processing chamber 20.

Figure 14:
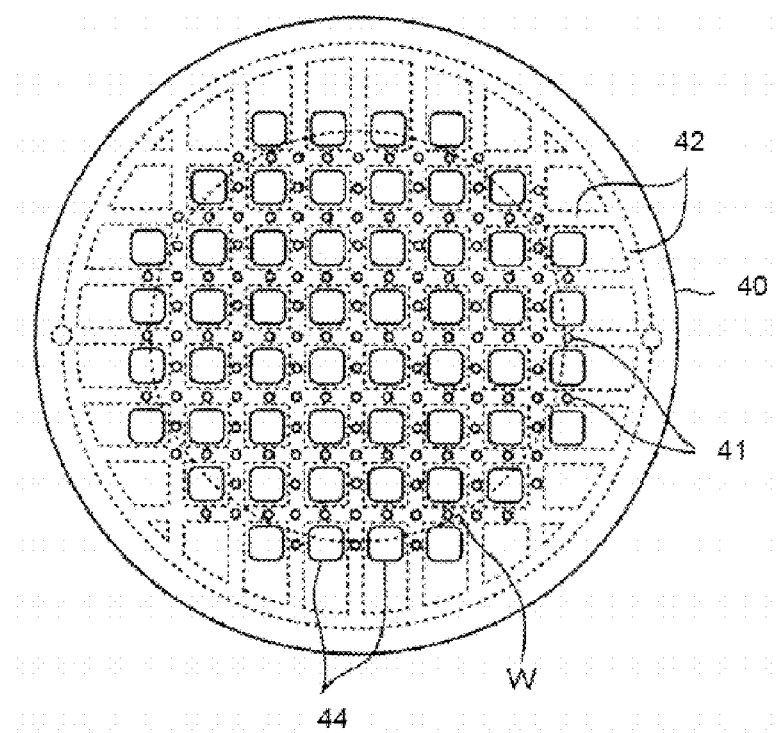
FIG. 14 illustrates a plan view of a gas supplying unit of the plasma processing system in FIG. 13.

A plan view of the process gas supply unit 40 is shown in FIG. 14. As shown in this figure, grid-like gas flow channels 42 are formed within the process gas supply unit 40. The grid-like gas flow channels 42 communicate with an upper-end of the plurality of gas supply holes 41, which are formed in the vertical direction. The lower portion of the plurality of gas supply holes 41 are openings facing the substrate holder 21. The plurality of gas supply holes 41 communicate with a process gas supply port 43 via the grid-patterned gas flow channels 42.

Further, a plurality of openings 44 are formed in the process gas supply unit 40 such that the plurality of openings 44 pass through the process gas supply unit 40 in the vertical direction. The plurality of openings 44 introduce the plasma gas, e.g., argon (Ar) gas, helium (He) gas, or other inert gases, into the plasma diffusion region R2 above the substrate holder 21. As shown in FIG. 14, the plurality of openings 44 are formed between adjacent gas flow channels 42. The process gas may be supplied from three separate process gas supply sources 45-47 to the process gas supply port 43. The process gas supply sources 45-47 may supply $H_2$ gas, $O_2$ gas, and Ar gas. However, other gases may be used.

The process gas flows through the grid-like gas flow channels 42 and is uniformly supplied into the plasma diffusion region R2 via the plurality of gas supply holes 41. The plasma processing system 10 further includes four valves (V1-V4) and four mass flow rate controller (MFC1-MFC4) for controlling a supply of the process gas.

An external microwave generator 55 provides a microwave of a predetermined frequency, e.g., 2.45 GHz, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30 in the plasma generation region R1, which in turn causes excitation of the process gas within the plasma processing chamber 20.

Figure 15:
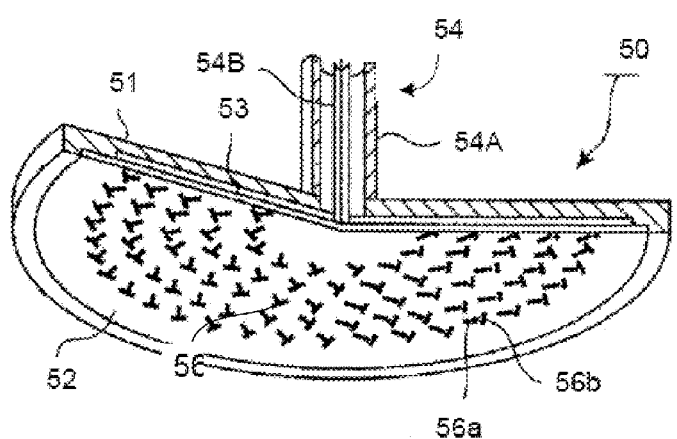
FIG. 15 illustrates a partial cross-sectional view of an antenna portion of the plasma processing system in FIG. 13.

FIG. 15 illustrates a partial cross-sectional view of the antenna unit 50. As shown in this figure, the antenna unit 50 may include a flat antenna main body 51, a radial line slot plate 52, and a dielectric plate 53 to shorten the wavelength of the microwave. The flat antenna main body 51 can have a circular shape with an open-ended bottom surface. The flat antenna main body 51 and the radial line slot plate 52 can be made of a conductive material.

A plurality of slots 56 are provided on the radial line slot plate 52 to generate a circularly polarized wave. The plurality of slots 56 are arranged in a substantially T-shaped form with a small gap between each slot. The plurality of slots 56 are arranged in a concentric circle pattern or a spiral pattern along a circumferential direction. Since the slots 56a and 56b are perpendicular to each other, a circularly polarized wave containing two orthogonal polarized components is radiated, as a plane wave, from the radial line slot plate 52.

The dielectric plate 53 can be made of a low loss dielectric material, e.g., aluminum oxide ($Al_2O_3$) or silicon nitride ($Si_3N_4$), that is located between the radial line slot plate 52 and the flat antenna main body 51. The radial line slot plate 52 may be mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling the energy of ions in the plasma that are drawn to the substrate W. The power supply source 22 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power between 0 W and 100 W, between 100 W and 200 W, between 200 W and 300 W, between 300 W and 400 W, or between 400 W and 500 W. One skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between −5 kV and +5 kV to the substrate holder 21.

Embodiments of corner rounding and trimming of nanowires used in semiconductor devices have been described in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of corner rounding and trimming of nanowires, the method comprising:
   providing in a process chamber a plurality of nanowires separated from each other by a void, wherein the plurality of nanowires have a height and at least substantially right angle corners;
   forming an oxidized surface layer on the plurality of nanowires using an oxidizing microwave plasma;
   removing the oxidized surface layer to trim the height and round the corners of the plurality of nanowires; and
   repeating the forming and removing at least once until the plurality of nanowires have a desired trimmed height and rounded corners.

2. The method of claim 1, wherein the plurality of nanowires consist of Si.

3. The method of claim 1, wherein the plurality of nanowires are selected from the group consisting of Si, SiGe, and compound semiconductors.

4. The method of claim 1, wherein the oxidizing microwave plasma includes plasma excited $O_2$ gas.

5. The method of claim 1, wherein the removing includes a chemical oxide removal (COR) process comprising:
   exposing the oxidized surface layer to HF gas and $NH_3$ gas to form reaction products on the plurality of nanowires; and
   heat-treating the plurality of nanowires to desorb the reaction products.

6. The method of claim 1, wherein the oxidizing microwave plasma utilizes a gas pressure of less or equal to 1 Torr in the process chamber.

7. The method of claim 1, wherein the oxidizing microwave plasma utilizes a gas pressure greater than 1 Torr in the process chamber.

8. A method of corner rounding and trimming of nanowires by microwave plasma, the method comprising:
   providing in a process chamber a plurality of nanowires separated from each other by a void, wherein the plurality of nanowires have a height and at least substantially right angle corners;

forming a first oxidized surface layer on the plurality of nanowires using a first oxidizing microwave plasma at a first gas pressure;

forming a second oxidized surface layer on the plurality of nanowires using a second oxidizing microwave plasma at a second gas pressure that is different than the first gas pressure;

removing the first and second oxidized surface layers to trim the height and round the corners of the plurality of nanowires; and repeating each of the forming and removing steps at least once until the plurality of nanowires have a desired trimmed height and rounded corners.

9. The method of claim 8, wherein the plurality of nanowires consist of Si.

10. The method of claim 8, wherein the plurality of nanowires are selected from the group consisting of Si, SiGe, and compound semiconductors.

11. The method of claim 8, wherein the first and second oxidizing microwave plasmas include plasma excited $O_2$ gas.

12. The method of claim 8, wherein the removing includes a chemical oxide removal (COR) process comprising:

exposing the first and second oxidized surface layers to HF gas and $NH_3$ gas to form reaction products on the plurality of nanowires; and heat-treating the plurality of nanowires to desorb the reaction products.

13. The method of claim 8, wherein the first gas pressure is less than the second gas pressure.

14. The method of claim 8, wherein the first gas pressure is less or equal to 1 Torr and the second gas pressure is greater than 1 Torr.

15. A method of corner rounding and trimming of nanowires by microwave plasma, the method comprising:

providing in a process chamber a plurality of nanowires separated from each other by a void, wherein the plurality of nanowires have a height and at least substantially right angle corners;

forming a first oxidized surface layer on the plurality of nanowires using a first oxidizing microwave plasma at a gas pressure less or equal to 1 Torr;

forming a second oxidized surface layer on the plurality of nanowires using a second oxidizing microwave plasma at a second gas pressure greater than 1 Torr;

removing the first and second oxidized surface layers to trim the height and round the corners of the plurality of nanowires; and repeating each of the forming and removing steps at least once until the plurality of nanowires have a desired trimmed height and rounded corners.

16. The method of claim 15, wherein the plurality of nanowires consist of Si.

17. The method of claim 15, wherein the plurality of nanowires are selected from the group consisting of Si, SiGe, and compound semiconductors.

18. The method of claim 15, wherein the first and second oxidizing microwave plasmas include plasma excited $O_2$ gas.

19. The method of claim 15, wherein the removing includes a chemical oxide removal (COR) process comprising:

exposing the first and second oxidized surface layers to HF gas and $NH_3$ gas to form reaction products on the plurality of nanowires; and heat-treating the plurality of nanowires to desorb the reaction products.

* * * * *